(12) United States Patent
Hui et al.

(10) Patent No.: US 6,483,153 B1
(45) Date of Patent: Nov. 19, 2002

(54) METHOD TO IMPROVE LDD CORNER CONTROL WITH AN IN-SITU FILM FOR LOCAL INTERCONNECT PROCESSING

(75) Inventors: Angela Hui, Fremont, CA (US); Paul Besser, Austin, TX (US); Minh-Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/418,316

(22) Filed: Oct. 14, 1999

(51) Int. Cl.⁷ .................. H01L 29/76; H01L 29/94; H01L 31/062; H01L 31/113; H01L 31/119
(52) U.S. Cl. .............. 257/382; 257/288; 257/383; 257/384
(58) Field of Search ................ 257/288, 382, 257/383, 384, 768, 773, 388, 774; 438/620, 734, 637, 714, 589, 618

(56) References Cited

U.S. PATENT DOCUMENTS

| | | | | |
|---|---|---|---|---|
| 5,174,858 A | * | 12/1992 | Yamamoto et al. | 438/301 |
| 5,275,963 A | * | 1/1994 | Cederbaum et al. | 438/624 |
| 5,459,354 A | * | 10/1995 | Hara | 257/754 |
| 5,621,232 A | * | 4/1997 | Ohno | 257/288 |
| 5,990,524 A | * | 11/1999 | En et al. | 257/382 |
| 6,153,457 A | * | 11/2000 | Kuo | 438/233 |

\* cited by examiner

Primary Examiner—Steven Loke
Assistant Examiner—Shouxiang Hu

(57) ABSTRACT

A method to improve LDD corner control during a local interconnect trench oxide etch on a semiconductor device by providing a first etch stop layer over the gate and active regions in the substrate and further providing thereon a second etch stop layer made of polysilicon and having of a different composition than that of the first etch stop layer. By forming a second etch stop layer of polysilicon the present invention improves the selectivity of the local interconnect trench oxide etch, thereby improving the ability of the first and second etch stop layers to stop the etch process at the critical interfaces.

7 Claims, 5 Drawing Sheets

US 6,483,153 B1

METHOD TO IMPROVE LDD CORNER CONTROL WITH AN IN-SITU FILM FOR LOCAL INTERCONNECT PROCESSING

FIELD OF THE INVENTION

The present invention relates to high-density semiconductor devices, and in particular, to a method to improve LDD corner control during a local interconnect trench oxide etch.

BACKGROUND OF THE INVENTION

A continuing trend in semiconductor technology is to build integrated circuits with more and/or faster semiconductor devices. The drive toward this ultra large-scale integration ULSI) has resulted in continued shrinking of device and circuit features. To take advantage of increasing number of devices and to form them into one or more circuits, the various devices need to be interconnected.

To accomplish interconnection on such a small scale, a local interconnect is typically used within an integrated circuit to provide an electrical connection between two or more conducting or semiconducting regions (e.g., active regions of one or more devices). For example, a plurality of transistors can be connected to form an inverting logical circuit using local interconnects.

The local interconnect is typically a relatively low resistance material, such as a conductor or doped semiconductor, that is formed to electrically couple the selected regions. For example, in certain arrangements, damascene techniques are used to provide local interconnects made of tungsten (W), or a like conductor, which is deposited within an etched opening, such as a via or a trench that connects the selected regions together. The use of local interconnects reduces the coupling burden on the subsequently formed higher layers to provide such connectivity, which reduces the overall circuit size and as such tends to increase the circuit's performance. Accordingly, as the density of the circuits increases there is a continuing need for more efficient, effective and precise processes for forming smaller local interconnects.

A problem arises in the formation of a local interconnect due to the relatively poor etch selectivity of the oxide dielectric material to the etch stop layer typically used to prevent overetching into a diffusion region. The overetching may lead to disconnection of the diffusion region at a field edge and result in a poor interconnection. This may best be understood by reference to FIGS. 1–3 to illustrate the concern.

FIG. 1 depicts a cross-section of a semiconductor device arrangement during one step of a local interconnect formation process. A silicon substrate 110 has polycrystalline silicon (hereafter polysilicon) gates 112 and 114 formed thereon. The polysilicon gate 114 is actually formed on the field oxide 116. A spacer 115 (such as an oxide spacer or nitride spacer) provides a shielding of the substrate 110 directly under the spacer 115 during implantation or diffusion of dopant substrate 110.

A plurality of silicide regions 118 are formed through conventional silicide techniques, for example, in a self-aligned silicide ("salicide") technique. The material comprising the silicide regions 118 may be selected from different materials, such as titanium silicide, cobalt silicide, tungsten silicide, etc. Silicide regions 118 provide a low resistance contact for the semiconductor devices.

The doped active region 120 is provided in the substrate 110 as defined by the doping. Typically, a heating step is performed to activate the dopants following the introduction of the dopants into the substrate 110.

An etch stop layer 122 is conformally deposited over the semiconductor wafer. An exemplary material for the etch stop layer is silicon oxynitride (SiON or SiN) and a conventional method of deposition is plasma enhanced chemical vapor deposition (PECVD). A layer of dielectric material, such as silicon dioxide derived from tetraethyl orthosilicate (TEOS), is deposited over the etch stop layer 122 and planarized. The dielectric layer 124 is then covered with a photoresist mask 126 which is patterned and developed with the desired local interconnect opening that is to be etched in the dielectric layer 124. In this example of FIG. 1, the opening in the photoresist layer 126 is positioned to provide a local interconnect opening in the dielectric layer 124 that will eventually connect the gate 114 of one device with the active region 120 of another device.

An etching step is then performed that etches through the dielectric layer 124 in accordance with the pattern in the photoresist layer 126. It is desirable to stop this first etching step at the etch stop layer 122. However, as depicted in FIG. 2, it is often difficult to precisely stop the etch at the etch stop layer 122, especially at the edge of the field 116. In this circumstance, the local interconnect opening 128 undesirably extends into the substrate 110 at area 130. The unintended etching through the etch stop layer 122 allows the etchant to etch the silicide region 118 and the diffusion region 120, creating the dip 130 into the substrate 110.

As seen in FIG. 3, after the deposition of a liner (or "barrier layer") that prevents diffusion of the conductive material into the other areas of the device, the local interconnect opening 128 is filled with a conductive material, such as tungsten 134. However, there remains a disconnection of the diffusion region 120 at the edge of the field 116, caused by the overetching through the etch-stop layer 122 during the etching of the dielectric layer 124. This disconnection and the reduced contact of the conductive metal 134 to the silicide region 118 of the diffusion region 120 decreases the performance of the circuit, and in extreme circumstances, may cause circuit failure.

There is a need for an improved etch selectivity to prevent the weakness at the field edge and disconnection of the diffusion region during a local interconnect formation process.

SUMMARY OF THE INVENTION

The present invention relates to high-density semiconductor devices, and in particular, to a method to improve LDD comer control during a local interconnect trench oxide etch on a semiconductor device. The present invention achieves this result by providing a first etch stop layer over the gate and active regions in the substrate and further providing thereon a second etch stop layer made of polysilicon and having a different composition than that of the first etch stop layer. By forming a second etch stop layer of polysilicon the present invention improves the selectivity of the local interconnect trench oxide etch, thereby improving the ability of the first and second etch stop layers to stop the etch process at the critical interfaces. This is particularly important for the area around the top comers of the gates and the LDD region that are subjected to extended overetching and physical bombardment during the etching of the oxide trench.

The present invention provides for a method for forming a viable local interconnect scheme. The method of the present invention includes the step of forming a gate on a substrate having active regions. A first etch stop layer is formed over the gate and over an exposed portion of the active regions. A second etch stop layer of polysilicon is formed over the first etch stop layer, where the second etch stop layer has a different composition than the first etch stop layer. The method further includes forming an oxide layer over the second etch stop layer and forming a trench in the oxide layer that extends to at least the second etch stop layer. The method includes removing an exposed portion of the first and second etch stop layers, and forming a local interconnect within the trench. Advantageously, the method of the present invention includes the incorporation of a second etch stop layer of polysilicon in order to improve the selectivity of the etch stop layers during the etching of the oxide trench.

The present invention additionally provides a semiconductor device including a gate located on a substrate having active regions. The device includes a first etch stop layer located over the gate and over an exposed portion of the active regions, and a second etch stop layer of polysilicon located over the first etch stop layer and having a composition different from the first etch stop layer. The device also includes an oxide layer located on the second etch stop layer. The oxide layer has a trench formed therein that extends to a portion of the gate. The device further includes a local interconnect positioned within the trench that is connected to the gate. The gate preferably further includes a pair of spacers located on the substrate abutting opposite sides of the gate. The first etch stop layer of the present invention is preferably made of SiON or SiN.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

BRIEF DESCRIPTION OF THE DRAWINGS

The present invention is illustrated by way of example, and not by way of limitation, in the figures of the accompanying drawings in which like reference numerals refer to similar elements.

DETAILED DESCRIPTION OF THE INVENTION

FIGS. 4 through 10 depict a semiconductor device of the present invention at various stages along the manufacturing process.

Figure 1:
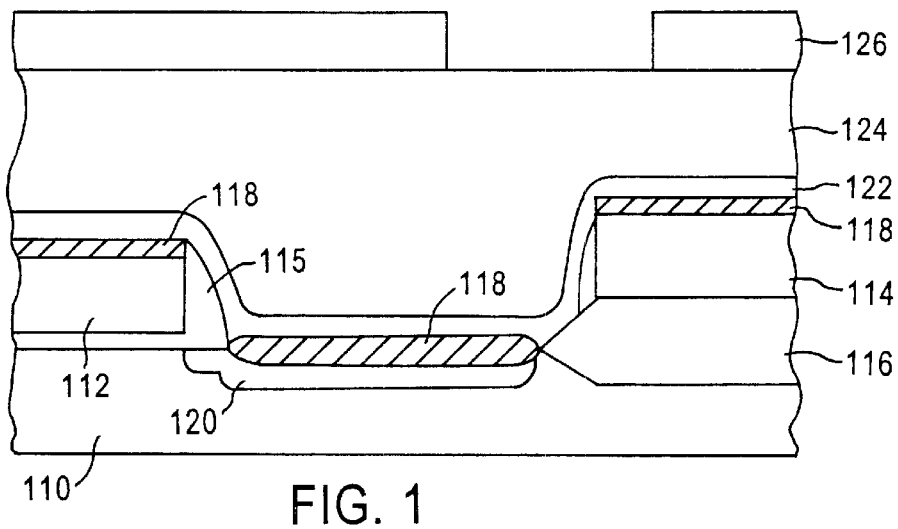
FIG. 1 depicts a cross-section of a semiconductor wafer prior to the etching of a local interconnect opening in a dielectric layer.
Figure 2:
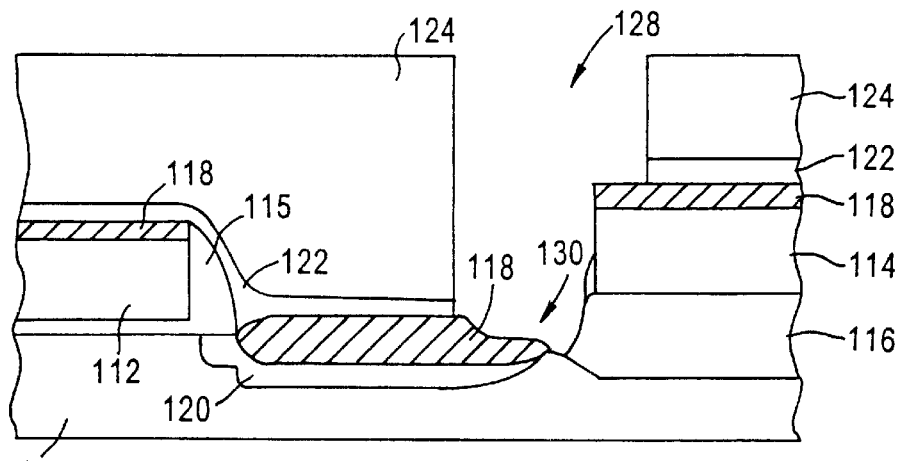
FIG. 2 depicts the cross-section of the portion of FIG. 1 following etching through of the dielectric layer and an etch stop layer in accordance with conventional etching techniques.
Figure 3:
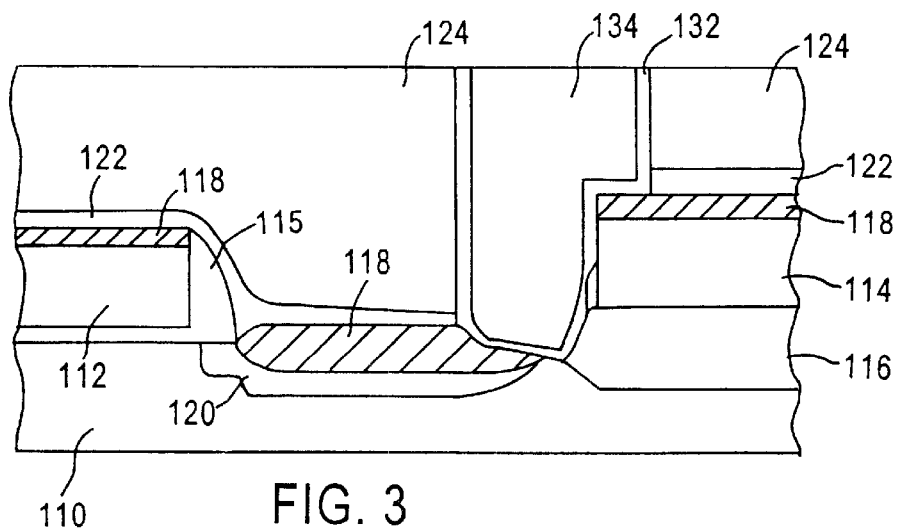
FIG. 3 depicts the formation of a local interconnect by the filling of a local interconnect opening with a barrier layer and a conductive material, and exhibits a disconnection of the diffusion region at a field edge.
Figure 4:
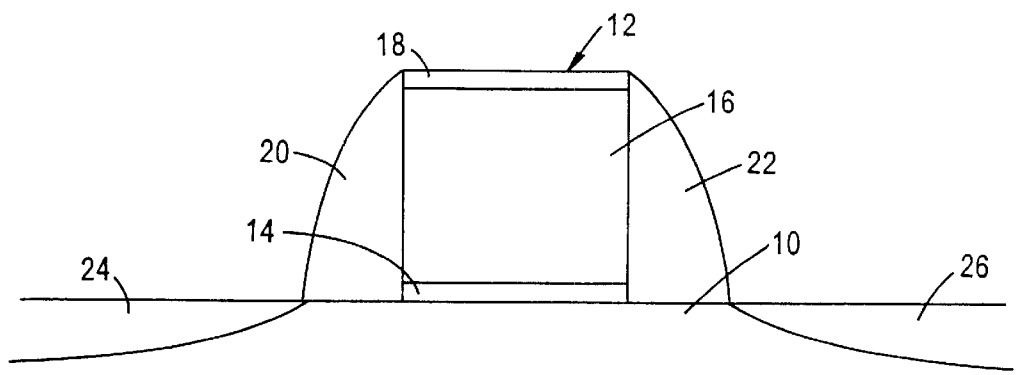
FIG. 4 is a cross-sectional view of a semiconductor device during the manufacture thereof according to the present invention depicting a substrate having a gate with spacers formed thereon.

FIG. 4 is a cross-sectional view of a semiconductor substrate 10 upon which a gate 12 is fabricated. The substrate 10 is made of silicon. The gate 12 is formed on the substrate 10 and includes a gate oxide layer 14 formed (i.e. deposited or grown) on a top surface of the substrate 10. The gate also includes a polysilicon layer 16 formed on the gate oxide layer 14. The polysilicon layer 16 has a layer 18 formed thereon. Layer 18 is made of material such as CoSi or TiSi. The gate 12 includes a pair of spacers, 20 and 22, formed on opposing sides of the gate 12. The substrate 10 includes active regions, or source and drain regions, 24 and 26, located on either side of the gate 12. The substrate 10, gate 12, spacers 20 and 22, and the active regions 24 and 26, are formed using salicide process such as CoSi or Ti, and consequently are not described in detail herein.

Figure 5:
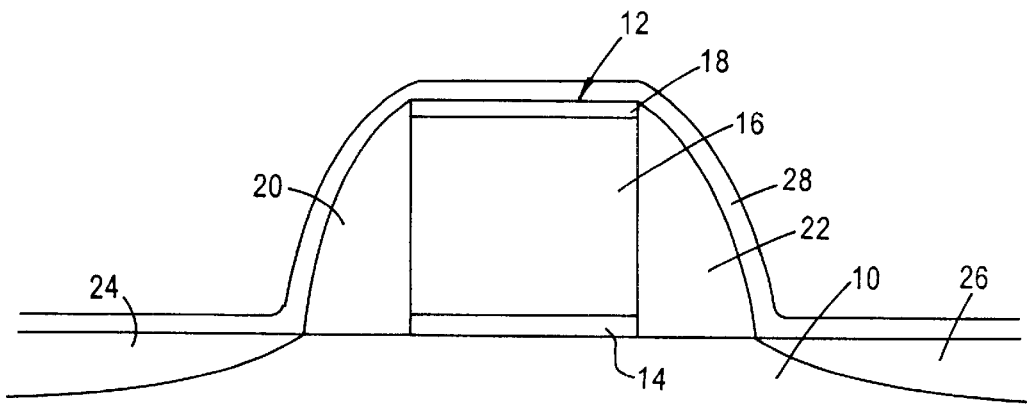
FIG. 5 is a cross-sectional view of a semiconductor device during the manufacture thereof according to the present invention depicting the device of FIG. 4 with a first etch stop layer formed thereon.

FIG. 5 depicts the semiconductor substrate 10 and gate 12 covered by a first etch stop layer or composite film 28 made of material resistant to an oxide etch, such as SiN or SiON. The first etch stop layer 28 is formed using any conventional process, such as depositing or growing the material on the substrate 10 and gate 12. The first etch stop layer 28 is preferably formed with a thickness in a range from about 400 Å to about 1000 Å.

Figure 6:
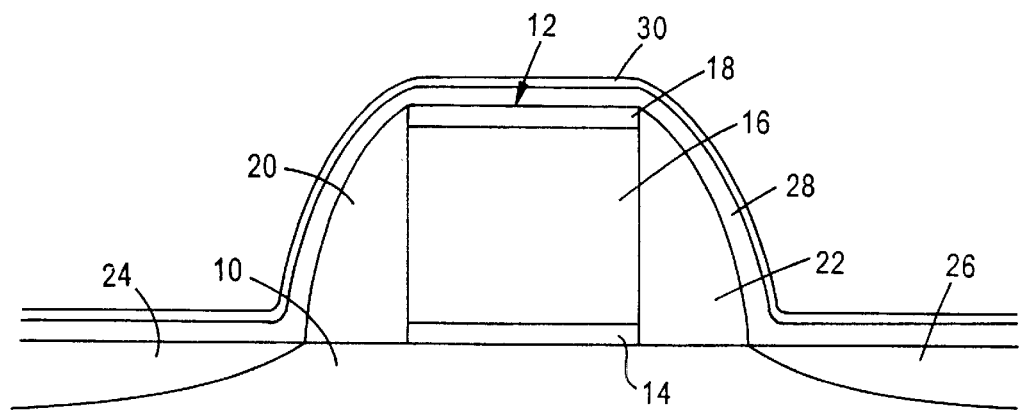
FIG. 6 is a cross-sectional view of a semiconductor device during the manufacture thereof according to the present invention depicting the device of FIG. 5 with a second etch stop layer of polysilicon formed thereon.

FIG. 6 depicts the first etch stop layer 28 covered by an in-situ second etch stop layer 30 made of material resistant to an oxide etch, such as polysilicon. The second etch stop layer 30 is formed using any conventional process, such as depositing or growing the material on the first etch stop layer 28. The second etch stop layer 30 is preferably formed with a thickness in a range from about 100 Å to about 300 Å. The second etch stop layer 30 is made of a material that has a composition that is different from that of the first etch stop layer 28. The selection of polysilicon as the second etch stop layer 30 is intended to provide a high degree of selectivity to the oxide etch chemistry used during the formation of the local interconnect. By providing a high degree of selectivity the second etch stop layer 30 helps prevent LDD corner punch through due to long overetching.

Figure 7:
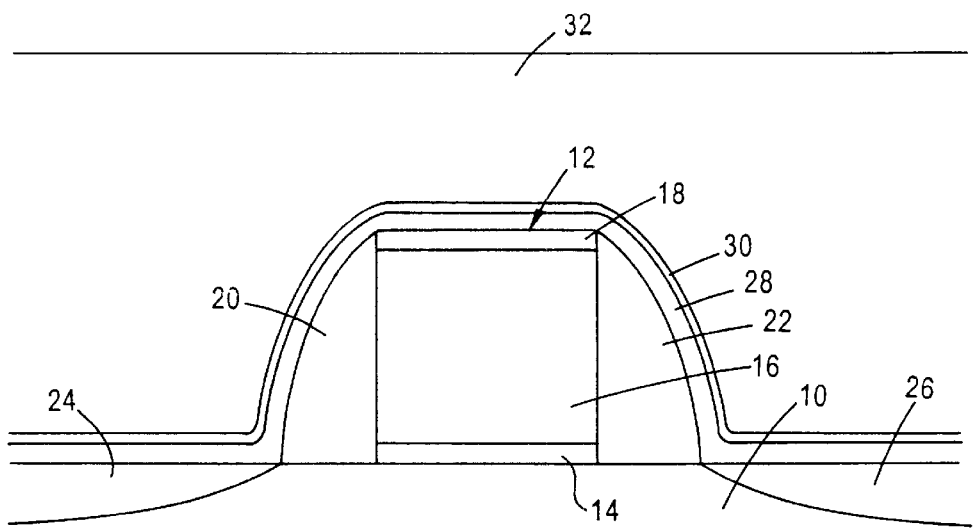
FIG. 7 is a cross-sectional view of a semiconductor device during the manufacture thereof according to the present invention depicting the device of FIG. 6 with an oxide layer formed thereon.

FIG. 7 depicts the second etch stop layer 30 covered by an oxide layer 32 (e.g. a TEOS layer). The oxide layer 32 is formed using any conventional process, such as depositing or growing the material on the second etch stop layer 30 and planarized by CMP (chemical mechanical polish). The oxide layer 32 is preferably formed with a thickness in a range from about 4000 Å to about 9000 Å (after planarization).

Figure 8:
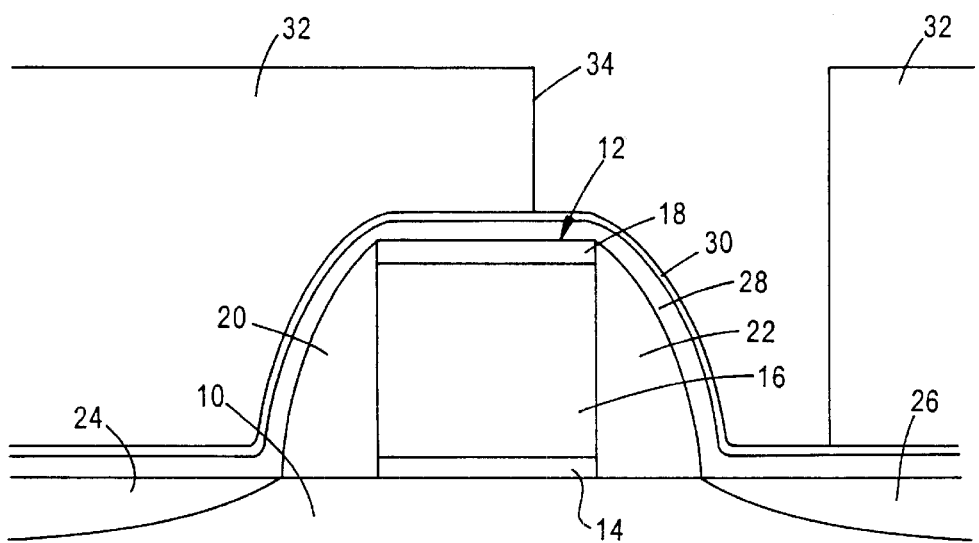
FIG. 8 is a cross-sectional view of a semiconductor device during the manufacture thereof according to the present invention depicting the device of FIG. 7 with a trench formed in the oxide layer in preparation for the formation of an interconnect layer.

FIG. 8 depicts the oxide layer 32 with a trench 34 formed therein to provide for the formation of the local interconnect. The trench 34 is etched in the oxide layer 32 using conventional etching techniques and oxide etching chemistry. The trench 34 in the oxide layer 32 is etched until the trench 34 reaches the second etch stop layer 30. The second etch stop layer 30 prevents the oxide etch from punching through to the substrate 10 or the gate 12, thereby preventing unwanted damage to those features that could reduce the viability of the semiconductor device. The present invention advantageously achieves this result by providing a second etch stop layer 30 that has a high selectivity for the oxide etch used during the formation of trench 34.

Figure 9:
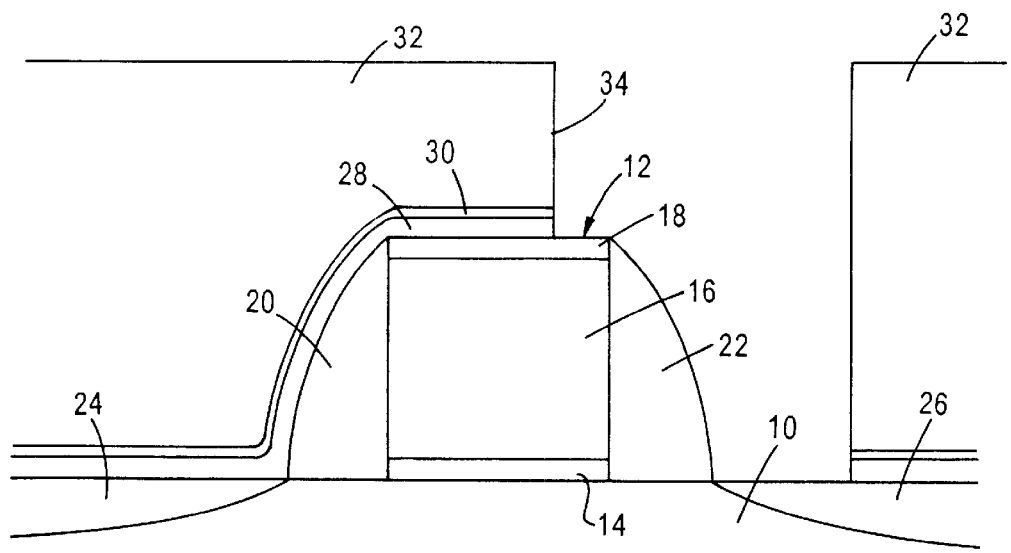
FIG. 9 is a cross-sectional view of a semiconductor device during the manufacture thereof according to the present invention depicting the device of FIG. 8 where an exposed portion of the first and second etch stop layers within the trench are removed.

FIG. 9 depicts the trench 34 extending through the second etch stop layer 30 and the first etch stop layer 28. The trench 34 is etched a second time to remove the exposed portions of the second etch stop layer 30 and the first etch stop layer 28. The trench 34, as depicted in FIG. 9, exposes a portion of the gate 12, spacer 22, and a portion of the upper surface of the substrate 10. The trench 34 is etched in the second etch stop layer 30 and the first etch stop layer 28 using conventional etching techniques.

Figure 10:
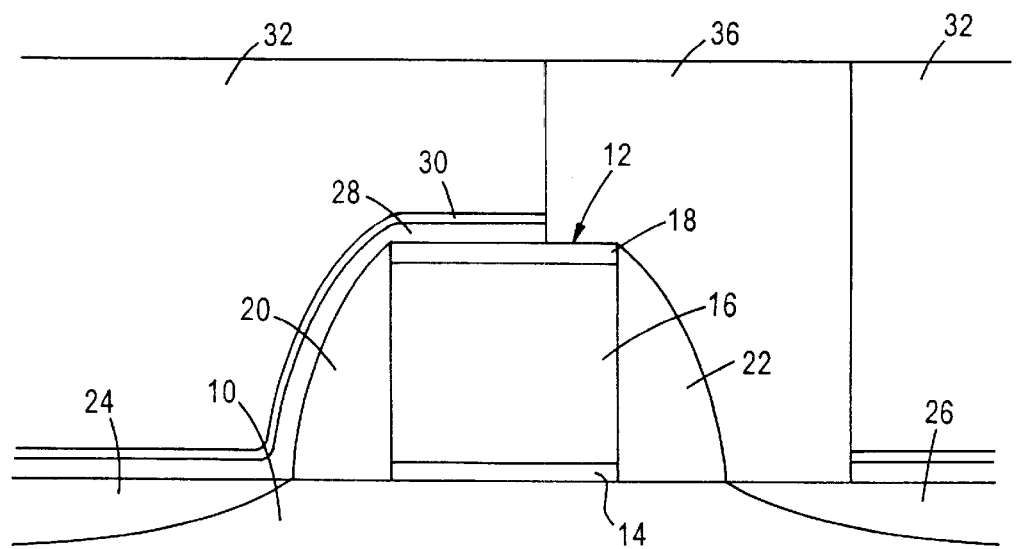
FIG. 10 is a cross-sectional view of a semiconductor device during the manufacture thereof according to the present invention depicting the device of FIG. 9 with an interconnect layer formed within the trench.

FIG. 10 depicts the trench 34 filled with a conductive material to form a local interconnect 36. The local interconnect 36 extends downward within the trench until the local interconnect 36 contacts a portion of the gate 12, spacer 22, and a portion of the upper surface of the substrate 10 at an active region. The local interconnect 36 is deposited within the trench 34 using conventional techniques. The upper surface of the local interconnect 36 is typically planarized as depicted in FIG. 10.

The device depicted in FIG. 10 can then be further processed to form a viable semiconductor device using conventional techniques.

Figure 11:
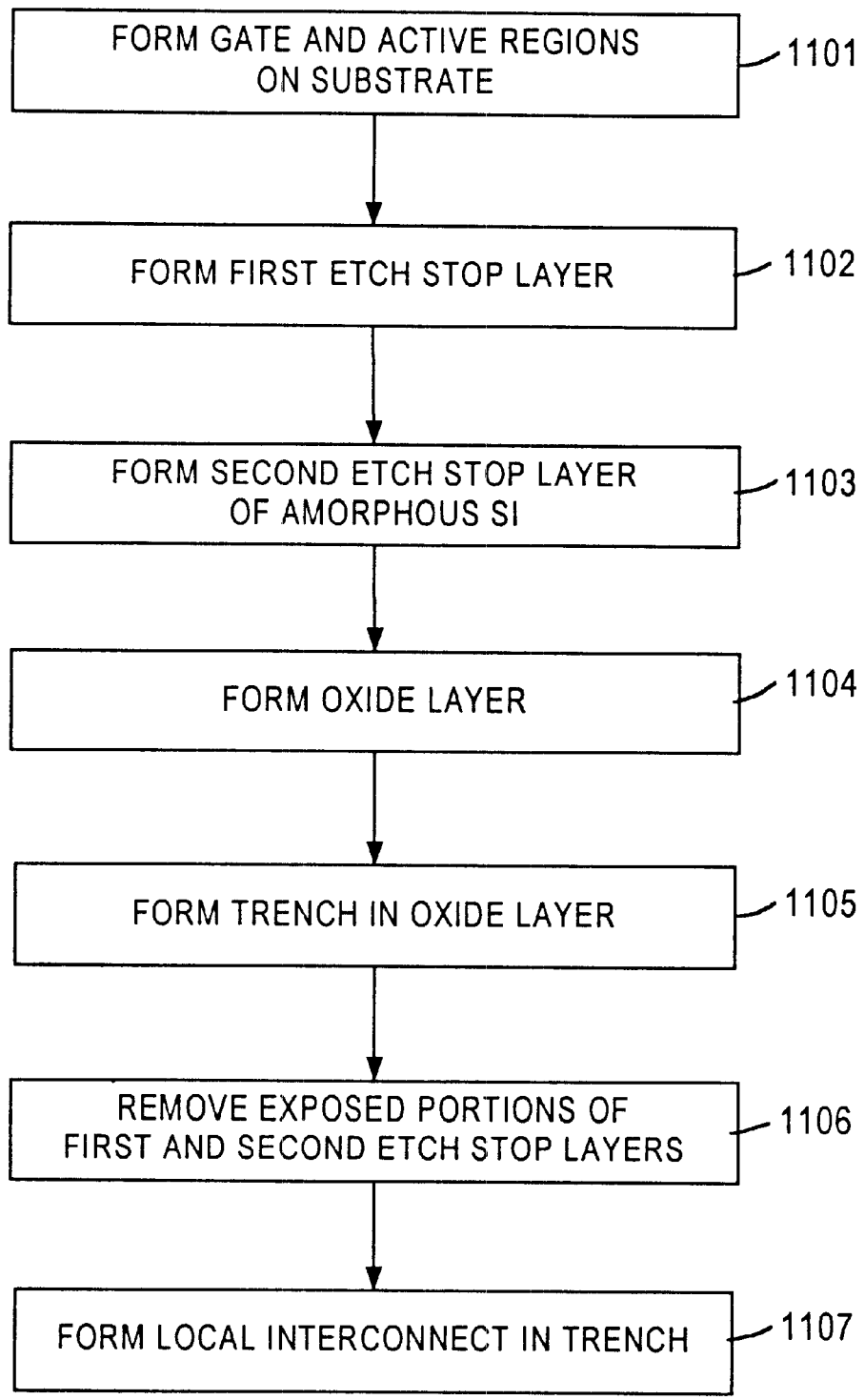
FIG. 11 is a flowchart of a method to improve LDD corner control during a local interconnect trench oxide etch on a semiconductor device according to the present invention.

The present invention further provides for a method of forming a viable local interconnect scheme, which is presented in FIG. 11 in flowchart format. FIGS. 4–10 generally depict the results of each of the steps of the method with respect to the preferred exemplary embodiment.

The method of the present invention includes a step 1101 of forming a gate and active regions on a silicon substrate. The gate includes a gate oxide layer formed (i.e. deposited or grown) on a top surface of the substrate. The gate also includes a polysilicon layer formed on the gate oxide layer. The polysilicon layer has a layer formed thereon. Layer is made of material such as CoSi or TiSi. The gate includes a pair of spacers formed on opposing sides of the gate. The substrate includes active regions, or source and drain regions located on either side of the gate. The substrate, gate, spacers, and the active regions, are formed using conventional processes that are known to those of ordinary skill in the art, and consequently are not described in detail herein.

The method also includes a step 1102 of forming a first etch stop layer over the gate and over an exposed portion of the active regions. The first etch stop layer or composite film is made of material resistant to an oxide etch, such as SiN or SiON. The first etch stop layer is formed using any conventional process, such as depositing or growing the material on the substrate and gate. The first etch stop layer is preferably formed with a thickness in a range from about 400 Å to about 1000Å.

The method further includes a step 1103 of forming a second etch stop layer over the first etch stop layer, where the second etch stop layer has a different composition than the first etch stop layer. The second etch stop layer is made of material resistant to an oxide etch, such as polysilicon. The second etch stop layer is formed using any conventional process, such as depositing or growing the material on the first etch stop layer. The second etch stop layer is preferably formed with a thickness in a range from about 100 Å to about 300 Å. The second etch stop layer is made of a material that has a composition that is different from that of the first etch stop layer. The use of polysilicon as the second etch stop layer is intended to provide a high degree of selectivity to the oxide etch chemistry used during the formation of the local interconnect. By providing a high degree of selectivity the second etch stop layer helps prevent LDD corner punch through due to long overetching.

The method includes a step 1104 of forming an oxide layer over the second etch stop layer. The oxide layer is formed using any conventional process, such as depositing or growing the material on the second etch stop layer. The oxide layer is preferably formed with a thickness in a range from about 4000 Å to about 9000 Å after CMP planarization.

The method includes a step 1105 of forming a trench in the oxide layer that extends to at least the second etch stop layer. The trench is formed in the oxide layer to provide for the formation of a local interconnect. The trench is etched in the oxide layer using conventional etching techniques and oxide etching chemistry. The trench in the oxide layer is etched until the trench reaches the second etch stop layer. The second etch stop layer prevents the oxide etch from punching through to the substrate or the gate, thereby preventing unwanted damage to those features that could reduce the viability of the semiconductor device. The present invention advantageously achieves this result by providing a second etch stop layer that has a high selectivity for the oxide etch used during the formation of trench.

The method includes a step 1106 of removing an exposed portion of the first and second etch stop layers. The trench is etched to remove the exposed portions of the second etch stop layer and the first etch stop layer. The second trench etch exposes a portion of the gate, a spacer, and a portion of the upper surface of the substrate.

The method also includes a step 1107 of forming a local interconnect within the trench. The local interconnect is formed by filling the trench with a conductive material. The local interconnect extends downward within the trench until the local interconnect contacts a portion of the gate, a spacer, and a portion of the upper surface of the substrate at an active region. The local interconnect is deposited within the trench using conventional techniques. The upper surface of the local interconnect is typically planarized and the device is then further processed to form a viable semiconductor device using conventional techniques.

The present invention relates to high-density semiconductor devices, and in particular, to a method to improve LDD corner control during a local interconnect trench oxide etch on a semiconductor device. The present invention achieves this result by advantageously providing a first etch stop layer over the gate and active regions in the substrate and further providing thereon a second etch stop layer made of polysilicon and having a different composition than that of the first etch stop layer. By forming a second etch stop layer of polysilicon the present invention improves the selectivity of the local interconnect trench oxide etch, thereby improving the ability of the first and second etch stop layers to stop the etch process at the critical interfaces. This is particularly important for the area around the top corners of the gates and the LDD region that are subjected to extended overetching and physical bombardment during the etching of the oxide trench.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising:

a gate located on a substrate having active regions;

a first etch stop layer located over said gate and over an exposed portion of said active regions;

a second etch stop layer of polysilicon located over said first etch stop layer, said second etch stop layer having a composition different from a composition of said first etch stop layer;

a dielectric layer located on said second etch stop layer, said dielectric layer having a trench formed therein and extending to a portion of said gate; and a local interconnect positioned within the trench and being connected to said gate;

wherein the trench extends to said substrate and the local interconnect is connected to said active regions, and said first etch stop layer is made of a material resistant to an oxide etch.

2. The semiconductor device according to claim 1, further comprising a pair of spacers located on said substrate abutting opposite sides of said gate.

3. The semiconductor device according to claim 1, wherein said first etch stop layer is made of SiON.

4. The semiconductor device according to claim 1, wherein said first etch stop layer is made of SiN.

5. The semiconductor device according to claim 1, wherein said first etch stop layer is formed with a thickness in a range from about 400 Å to about 1000 Å.

6. The semiconductor device according to claim 1, wherein said second etch stop layer is formed with a thickness in a range from about 100 Å about 300 Å.

7. The semiconductor device of claim 1, wherein said dielectric layer is an oxide layer.

* * * * *